United States Patent
Kuriki et al.

(10) Patent No.: US 9,685,275 B2
(45) Date of Patent: Jun. 20, 2017

(54) POWER STORAGE DEVICE AND METHOD FOR MANUFACTURING THE SAME

(75) Inventors: Kazutaka Kuriki, Kanagawa (JP); Mikio Yukawa, Kanagawa (JP); Yuji Asano, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 603 days.

(21) Appl. No.: 13/088,592

(22) Filed: Apr. 18, 2011

(65) Prior Publication Data

US 2011/0266654 A1 Nov. 3, 2011

(30) Foreign Application Priority Data

Apr. 28, 2010 (JP) .................... 2010-104587
May 28, 2010 (JP) .................... 2010-122473
(Continued)

(51) Int. Cl.
H01L 29/02 (2006.01)
H01G 11/06 (2013.01)
(Continued)

(52) U.S. Cl.
CPC .......... *H01G 11/06* (2013.01); *C30B 25/005* (2013.01); *C30B 29/06* (2013.01); *C30B 29/62* (2013.01);
(Continued)

(58) Field of Classification Search
USPC .............................. 429/218.1–233
See application file for complete search history.

(56) References Cited

U.S. PATENT DOCUMENTS 3,796,598 A 3/1974 Gejyo et al.
4,155,781 A 5/1979 Diepers
(Continued)

FOREIGN PATENT DOCUMENTS

EP 1 231 651 A1 8/2002
EP 1 231 653 A1 8/2002
(Continued)

OTHER PUBLICATIONS

Jung.H et al., "Amorphous silicon thin-film negative electrode prepared by low pressure chemical vapor deposition for lithium-ion batteries,", Solid State Communications, Feb. 1, 2003, vol. 125, No. 7-8, pp. 387-390.
(Continued)

*Primary Examiner* — Ula C Ruddock
*Assistant Examiner* — Osei Amponsah
(74) *Attorney, Agent, or Firm* — Nixon Peabody LLP; Jeffrey L. Costellia

(57) ABSTRACT

Provided is a method for manufacturing a power storage device in which a crystalline silicon layer including a whisker-like crystalline silicon region is formed as an active material layer over a current collector by a low-pressure CVD method in which heating is performed using a deposition gas containing silicon. The power storage device includes the current collector, a mixed layer formed over the current collector, and the crystalline silicon layer functioning as the active material layer formed over the mixed layer. The crystalline silicon layer includes a crystalline silicon region and a whisker-like crystalline silicon region including a plurality of protrusions which project over the crystalline silicon region. With the protrusions, the surface area of the crystalline silicon layer functioning as the active material layer can be increased.

20 Claims, 10 Drawing Sheets

(30) Foreign Application Priority Data

| | | |
|---|---|---|
| May 28, 2010 | (JP) | 2010-122609 |
| May 28, 2010 | (JP) | 2010-122610 |

(51) Int. Cl.

| | |
|---|---|
| H01G 11/28 | (2013.01) |
| H01G 11/30 | (2013.01) |
| H01G 11/46 | (2013.01) |
| H01G 11/50 | (2013.01) |
| H01L 49/02 | (2006.01) |
| H01G 11/26 | (2013.01) |
| H01M 4/04 | (2006.01) |
| H01M 4/134 | (2010.01) |
| H01M 4/1395 | (2010.01) |
| H01M 4/38 | (2006.01) |
| H01M 4/66 | (2006.01) |
| C30B 25/00 | (2006.01) |
| C30B 29/06 | (2006.01) |
| C30B 29/62 | (2006.01) |
| C30B 33/02 | (2006.01) |
| H01L 21/02 | (2006.01) |
| H01M 10/0525 | (2010.01) |
| H01M 10/0583 | (2010.01) |

(52) U.S. Cl.

CPC .............. *C30B 33/02* (2013.01); *H01G 11/26* (2013.01); *H01G 11/28* (2013.01); *H01G 11/30* (2013.01); *H01G 11/46* (2013.01); *H01G 11/50* (2013.01); *H01L 28/82* (2013.01); *H01M 4/0428* (2013.01); *H01M 4/134* (2013.01); *H01M 4/1395* (2013.01); *H01M 4/386* (2013.01); *H01M 4/661* (2013.01); *H01M 4/667* (2013.01); *H01L 21/0262* (2013.01); *H01L 21/02532* (2013.01); *H01L 21/02587* (2013.01); *H01M 10/0525* (2013.01); *H01M 10/0583* (2013.01); *Y02E 60/13* (2013.01); *Y02P 70/54* (2015.11); *Y02T 10/7022* (2013.01)

(56) References Cited

U.S. PATENT DOCUMENTS

| | | | | |
|---|---|---|---|---|
| 5,338,625 | A * | 8/1994 | Bates et al. | 429/322 |
| 6,451,113 | B1 | 9/2002 | Givargizov | |
| 6,685,804 | B1 | 2/2004 | Ikeda et al. | |
| 6,844,113 | B2 | 1/2005 | Yagi et al. | |
| 6,887,511 | B1 | 5/2005 | Shima et al. | |
| 7,015,496 | B2 | 3/2006 | Ohnuma et al. | |
| 7,192,673 | B1 | 3/2007 | Ikeda et al. | |
| 7,235,330 | B1 | 6/2007 | Fujimoto et al. | |
| 7,241,533 | B1 | 7/2007 | Ikeda et al. | |
| 7,326,491 | B2 | 2/2008 | Takahashi et al. | |
| 7,368,306 | B2 | 5/2008 | Ohnuma et al. | |
| 7,396,409 | B2 | 7/2008 | Hatta et al. | |
| 7,410,728 | B1 | 8/2008 | Fujimoto et al. | |
| 7,691,533 | B2 | 4/2010 | Sano et al. | |
| 7,794,878 | B2 | 9/2010 | Kogetsu | |
| 7,794,881 | B1 | 9/2010 | Fujimoto et al. | |
| 7,816,031 | B2 | 10/2010 | Cui et al. | |
| 8,304,105 | B2 | 11/2012 | Kang et al. | |
| 2005/0079421 | A1 | 4/2005 | Konishiike et al. | |
| 2005/0191547 | A1 | 9/2005 | Konishiike et al. | |
| 2005/0244324 | A1 | 11/2005 | Hatta et al. | |
| 2006/0127773 | A1 * | 6/2006 | Kawakami et al. | 429/245 |
| 2007/0007239 | A1 * | 1/2007 | Lee et al. | 216/13 |
| 2007/0166613 | A1 * | 7/2007 | Kogetsu et al. | 429/218.1 |
| 2007/0232028 | A1 | 10/2007 | Lee et al. | |
| 2007/0292339 | A1 | 12/2007 | Kubomura et al. | |
| 2008/0020281 | A1 * | 1/2008 | Kogetsu | C23C 14/226 429/231.5 |
| 2009/0050204 | A1 | 2/2009 | Habib | |
| 2009/0117462 | A1 * | 5/2009 | Okazaki | H01M 4/04 429/218.1 |
| 2009/0136847 | A1 * | 5/2009 | Jeong et al. | 429/218.1 |
| 2009/0317726 | A1 | 12/2009 | Hirose et al. | |
| 2009/0325365 | A1 | 12/2009 | Park et al. | |
| 2010/0086837 | A1 | 4/2010 | Asari et al. | |
| 2010/0092856 | A1 | 4/2010 | Hirose et al. | |
| 2010/0151322 | A1 * | 6/2010 | Sato et al. | 429/218.1 |
| 2010/0178564 | A1 | 7/2010 | Asari et al. | |
| 2010/0209784 | A1 | 8/2010 | Yamazaki et al. | |
| 2010/0266898 | A1 | 10/2010 | Yamamoto et al. | |
| 2011/0020713 | A1 | 1/2011 | Cui et al. | |
| 2011/0151290 | A1 | 6/2011 | Cui et al. | |
| 2011/0294005 | A1 | 12/2011 | Kuriki et al. | |
| 2011/0294011 | A1 | 12/2011 | Kuriki et al. | |
| 2011/0300445 | A1 | 12/2011 | Murakami et al. | |
| 2011/0305950 | A1 | 12/2011 | Kuriki et al. | |
| 2012/0003383 | A1 | 1/2012 | Furuno | |
| 2012/0003807 | A1 | 1/2012 | Furuno et al. | |
| 2012/0328962 | A1 | 12/2012 | Takeuchi et al. | |

FOREIGN PATENT DOCUMENTS

| | | | |
|---|---|---|---|
| EP | 1 231 654 A1 | 8/2002 | |
| EP | 1 237 210 A1 | 9/2002 | |
| EP | 1 244 163 A1 | 9/2002 | |
| EP | 1 244 164 A1 | 9/2002 | |
| EP | 1 246 278 A1 | 10/2002 | |
| EP | 1562250 A | 8/2005 | |
| EP | 1708214 A | 10/2006 | |
| JP | 2001-210315 | 8/2001 | |
| JP | 2002-083594 A | 3/2002 | |
| JP | 2002-164556 A | 6/2002 | |
| JP | 2002-373644 | * 12/2002 | H01M 4/02 4/4 |
| JP | 2003-246700 | 9/2003 | |
| JP | 2003-258285 A | 9/2003 | |
| JP | 2004-224576 | 8/2004 | |
| JP | 2004-281317 | 10/2004 | |
| JP | 2006-080450 A | 3/2006 | |
| JP | 2007-194076 A | 8/2007 | |
| JP | 2008-512838 | 4/2008 | |
| JP | 2008-103118 A | 5/2008 | |
| JP | 2009-134917 A | 6/2009 | |
| JP | 2009-252579 | 10/2009 | |
| JP | 2010-262752 | 11/2010 | |
| KR | 2006-0023899 | 3/2006 | |
| TW | I249868 | 2/2006 | |
| TW | I252603 | 4/2006 | |
| TW | I256167 | 6/2006 | |
| TW | I274432 | 2/2007 | |
| TW | I294629 | 3/2008 | |
| WO | WO-01/31723 | 5/2001 | |
| WO | WO-2005/050772 | 6/2005 | |
| WO | WO-2006/028316 A1 | 3/2006 | |
| WO | WO-2009/038897 | 3/2009 | |

OTHER PUBLICATIONS

"International Search Report (Application No. PCT/JP2011/059219; PCT13493/13579/13580/13582) Dated Jul. 19, 2011,".

"Written Opinion (Application No. PCT/JP2011/059219; PCT13493/13579/13580/13582)Dated Jul. 19, 2011,".

Kamins et al., "Ti-catalyzed Si nanowires by chemical vapor deposition: Microscopy and growth mechanisms", J. Appl. Phys. (Journal of Applied Physics), Jan. 15, 2001, vol. 89, No. 2, pp. 1008-1016.

Kohno et al., "Silicon Nanoneedles Grown by a Simple Thermal Treatment Using Metal-Sulfur Catalysts", Jpn. J. Appl. Phys. (Japanese Journal of Applied Physics), Feb. 1, 2002, vol. 41, Part 1, No. 2A, pp. 577-578.

Cui et al., "Crystalline-Amorphous Core-Shell Silicon Nanowires for High Capacity and High Current Battery Electrodes", Nano Letters, 2009, vol. 9, No. 1, pp. 491-495.

(56) References Cited

OTHER PUBLICATIONS

Gangloff.L et al., "Self-Aligned, Gated Arrays of Individual Nanotube and Nanowire Emitters", Nano Letters, Sep. 1, 2004, vol. 4, No. 9, pp. 1575-1579.
Leu.I et al., "Chemical Vapor Deposition of Silicon Carbide Whiskers Activated by Elemental Nickel", J. Electrochem Soc. (Journal of the Electrochemical Society), 1999, vol. 146, No. 1, pp. 184-188.
Pedraza.A et al., "Silicon microcolumn arrays grown by nanosecond pulsed-excimer laser irradiation", Appl. Phys. Lett. (Applied Physics Letters), Apr. 19, 1999, vol. 74, No. 16, pp. 2322-2324.
Felter.T et al., "Cathodoluminescent Field Emission Flat Panel Display Prototype Built Using Arrays of Diamond-Coated Silicon Tips", SID Digest '98 : SID International Symposium Digest of Technical Papers, May 1, 1998, vol. 29, pp. 577-581.
Albuschies.J et al., "High-Density Silicon Nanowire Growth From Self-Assembled AU Nanoparticles", Microelectronic Engineering, Feb. 20, 2006, vol. 83, pp. 1550-1533, Elsevier.
Chan.C et al., "High-performance lithium battery anodes using silicon nanowires", Nature Nanotechnology, Dec. 16, 2007, vol. 3, pp. 31-35.
Taiwanese Office Action (Application No. 100113546) Dated Mar. 26, 2015.

\* cited by examiner

20um

10um

POWER STORAGE DEVICE AND METHOD FOR MANUFACTURING THE SAME

TECHNICAL FIELD

The present invention relates to a power storage device and a method for manufacturing the power storage device.

Note that the power storage device indicates all elements and devices which have a function of storing power.

BACKGROUND ART

In recent years, power storage devices such as lithium-ion secondary batteries, lithium-ion capacitors, and air cells have been developed.

An electrode for the power storage device is manufactured by providing an active material over a surface of a current collector. As the active material, a material which can adsorb and release ions functioning as carriers, such as carbon or silicon, is used. For example, silicon or phosphorus-doped silicon has an advantage of larger theoretical capacity than carbon and larger capacity of a power storage device (e.g., Patent Document 1).

REFERENCE

Patent Document

[Patent Document 1] Japanese Published Patent Application No. 2001-210315

DISCLOSURE OF INVENTION

However, even when silicon is used as a negative electrode active material, it is difficult to obtain as large a discharge capacity as the theoretical capacity. In view of the above, an object of one embodiment of the present invention is to provide a power storage device whose discharge capacity is larger and a method for manufacturing the power storage device.

One embodiment of the present invention is a method for manufacturing a power storage device in which a crystalline silicon layer including a whisker-like crystalline silicon region is formed as an active material layer over a current collector by a low-pressure chemical vapor deposition (low-pressure CVD) method in which deposition is performed by heating using a gas containing silicon.

Another embodiment of the present invention is a power storage device including a current collector and a crystalline silicon layer which is formed over the current collector and functions as an active material layer, wherein the crystalline silicon layer includes a crystalline silicon region and a whisker-like crystalline silicon region including a plurality of protrusions which project over the crystalline silicon region.

Another embodiment of the present invention is a power storage device including a current collector and a crystalline silicon layer which is formed over the current collector and functions as an active material layer, wherein the crystalline silicon layer includes a crystalline silicon region and a whisker-like crystalline silicon region including a plurality of protrusions which project over the crystalline silicon region, a length in an axis of a protrusion in the whisker-like crystalline silicon region is greater than or equal to 0.5 μm and less than or equal to 1000 μm, and a width of the protrusion at an interface between the crystalline silicon region and the protrusion is greater than or equal to 50 nm and less than or equal to 10 μm.

Another embodiment of the present invention is a power storage device including a current collector and a crystalline silicon layer which is formed over the current collector and functions as an active material layer, wherein a surface of the crystalline silicon layer includes a columnar or needle-like protrusion, and the protrusion includes a depression or a projection.

Another embodiment of the present invention is a power storage device including a current collector and a crystalline silicon layer which is formed over the current collector and functions as an active material layer, wherein the crystalline silicon layer includes a first region which covers the current collector and a second region which is formed over the first region and includes a columnar or needle-like protrusion, and the protrusion includes a depression or a projection.

Note that a mixed layer may be included between the current collector and the crystalline silicon layer. In addition, a metal oxide layer which is formed using an oxide of a metal element contained in the current collector may be included between the mixed layer and the crystalline silicon layer.

The whisker-like crystalline silicon region includes a plurality of protrusions, and directions in which the plurality of protrusions extend (that is, directions of axes) may be random. Alternatively, directions in which the plurality of protrusions extend (that is, directions of axes) in the whisker-like crystalline silicon region may be the normal direction to the current collector.

Since the crystalline silicon layer functioning as the active material layer includes the whisker-like crystalline silicon region, the surface area of the crystalline silicon layer is increased and the discharge capacity can be larger.

For the current collector, a material with high conductivity can be used, such as a metal element typified by platinum, aluminum, copper, or titanium. In addition, the current collector can be formed using a metal element which forms silicide by reacting with silicon.

The mixed layer includes silicon and a metal element. The mixed layer may include silicon and a metal element contained in the current collector. When the current collector is formed using a metal element which forms silicide by reacting with silicon, the mixed layer may be formed using silicide.

With the mixed layer between the current collector and the active material layer, a low-density region (a coarse region) is not formed between the current collector and the active material layer, so that interface characteristics between the current collector and the active material layer can be improved.

In addition, the metal oxide layer may be provided between the mixed layer and the active material layer. The metal oxide layer is formed using an oxide of a metal element contained in the current collector. By formation of the metal oxide layer using an oxide semiconductor, resistance between the current collector and the active material layer can be reduced, and the discharge capacity can be even larger than those of the case where the metal oxide layer is formed using an insulator.

With the above protrusions, the surface area per unit mass of the active material layer is increased. Since the surface area is increased, the rate at which a reaction substance (e.g., lithium ions) in a power storage device is adsorbed to crystalline silicon or the rate at which the reaction substance is released from the crystalline silicon becomes high per unit mass. Since the rate at which the reaction substance is adsorbed or released is high, the amount of adsorption or release of the reaction substance at a high current density is increased; therefore, the discharge capacity or charge capacity of the power storage device is larger. That is, with the use of the whisker-like crystalline silicon layer as the active material layer, the performance of the power storage device can be improved.

According to one embodiment of the present invention, a power storage device having a large discharge capacity can be manufactured.

BEST MODE FOR CARRYING OUT THE INVENTION

Figure 1A:
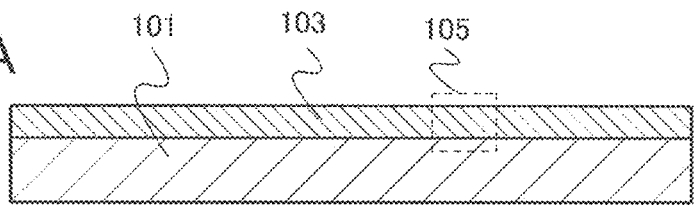
FIGS. 1A to 1D are cross-sectional views illustrating a method for manufacturing a negative electrode of a power storage device.

Hereinafter, embodiments of the present invention will be described with reference to the drawings. Note that the invention is not limited to the following description, and it will be easily understood by those skilled in the art that various changes and modifications can be made without departing from the spirit and scope of the invention. Thus, the present invention should not be interpreted as being limited to the following description of the embodiments. In description with reference to the drawings, in some cases, the same reference numerals are used in common for the same portions in different drawings. Further, in some cases, the same hatching patterns are applied to similar parts, and the similar parts are not necessarily designated by reference numerals.

Embodiment 1

In this embodiment, an electrode for a power storage device which is one embodiment of the present invention and a method for manufacturing the electrode will be described.

The method for manufacturing the electrode of the power storage device will be described with reference to FIGS. 1A to 1D and FIG. 2.

As illustrated in FIG. 1A, a crystalline silicon layer is formed as an active material layer 103 over a current collector 101 by a thermal CVD method, preferably a low-pressure CVD method (hereinafter referred to as an LPCVD method).

The current collector 101 functions as a current collector of the electrode. Thus, a conductive material having a foil shape, a plate shape, or a net shape is used. The current collector 101 may be formed using, without a particular limitation, a metal element with high conductivity typified by platinum, aluminum, copper, or titanium. Note that the current collector 101 is preferably formed using an aluminum alloy to which an element which improves heat resistance, such as silicon, titanium, neodymium, scandium, or molybdenum, is added. Alternatively, the current collector 101 may be formed using a metal element which forms silicide by reacting with silicon. Examples of the metal element which forms silicide by reacting with silicon include zirconium, titanium, hafnium, vanadium, niobium, tantalum, chromium, molybdenum, tungsten, cobalt, nickel, and the like.

The crystalline silicon layer is formed as the active material layer 103 by the LPCVD method. In performing the LPCVD method, heating is performed at higher than 550° C. and lower than or equal to the temperature at which an LPCVD apparatus or the current collector 101 can withstand, preferably higher than or equal to 580° C. and lower than 650° C., and a deposition gas containing silicon is used as a source gas. Examples of the deposition gas containing silicon include silicon hydride, silicon fluoride, and silicon chloride; typically, $SiH_4$, $Si_2H_6$, $SiF_4$, $SiCl_4$, $Si_2Cl_6$, and the like are given. Note that one or more of a rare gas such as helium, neon, argon, and xenon and hydrogen may be mixed in the source gas.

By the LPCVD method, ions and electrons transfer easily at the interface between the current collector 101 and the active material layer 103 and the adhesion can be increased.

Note that impurity elements imparting one conductivity type, such as phosphorus or boron, may be added to the crystalline silicon layer. A crystalline silicon layer to which the impurity elements imparting one conductivity type, such as phosphorus or boron, are added has higher conductivity, so that the electric conductivity of the electrode can be increased. Therefore, the discharge capacity can be even larger.

By formation of the crystalline silicon layer as the active material layer 103 by the LPCVD method, a low-density region is not formed between the current collector 101 and the active material layer 103, the ions and electrons transfer easily at the interface between the current collector 101 and the crystalline silicon layer, and the adhesion can be increased. One of the reasons is that active species of the source gas are supplied to the crystalline silicon layer that is being deposited in a step of forming the crystalline silicon layer, so that silicon diffuses into the current collector 101 from the crystalline silicon layer. Even if a region (a coarse region) lacking in silicon is formed, the active species of the source gas are continuously supplied to the region; therefore, a low-density region is unlikely to be formed in the crystalline silicon layer. In addition, since the crystalline silicon layer is formed over the current collector 101 by vapor-phase growth, throughput can be improved.

Figure 1B:
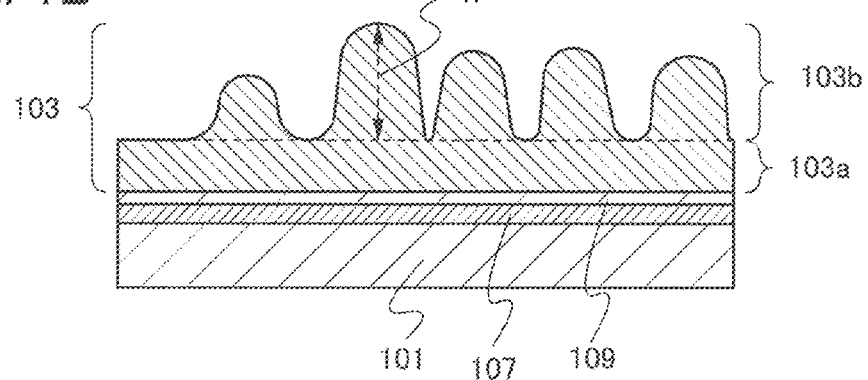

Here, an enlarged view of the current collector 101 and the active material layer 103 surrounded by a dashed line 105 is illustrated in FIG. 1B.

As illustrated in FIG. 1B, a mixed layer 107 is formed over the current collector 101. The mixed layer 107 may be formed using silicon and a metal element contained in the current collector 101. Note that the mixed layer 107 formed using silicon and a metal element contained in the current collector 101 is formed in the following manner. In formation of the crystalline silicon layer as the active material layer 103 by the LPCVD method, heating is performed and silicon contained in the crystalline silicon layer diffuses into the current collector 101.

When the current collector 101 is formed using a metal element which forms silicide by reacting with silicon, silicide including silicon and the metal element which forms silicide is formed in the mixed layer 107; typically, one or more of zirconium silicide, titanium silicide, hafnium silicide, vanadium silicide, niobium silicide, tantalum silicide, chromium silicide, molybdenum silicide, tungsten silicide, cobalt silicide, and nickel silicide, is/are formed. Alternatively, an alloy layer of silicon and a metal element which forms silicide is formed.

Note that oxygen is contained as an impurity in the active material layer 103 and the mixed layer 107 in some cases. This is because oxygen is desorbed from a quartz chamber of the LPCVD apparatus by the heating performed in the formation of the crystalline silicon layer as the active material layer 103 by the LPCVD method, and the oxygen diffuses into the active material layer 103 and the mixed layer 107.

Over the mixed layer 107, a metal oxide layer 109 which is formed using an oxide of the metal element contained in the current collector 101 may be formed. This is because oxygen is desorbed from the quartz chamber of the LPCVD apparatus by the heating performed in the formation of the crystalline silicon layer as the active material layer 103 by the LPCVD method, and the current collector 101 is oxidized. Note that when the crystalline silicon layer is formed by the LPCVD method, by filling the chamber with a rare gas such as helium, neon, argon, or xenon, the metal oxide layer 109 is not formed.

When the current collector 101 is formed using the metal element which forms silicide by reacting with silicon, a metal oxide layer containing an oxide of the metal element which forms silicide by reacting with silicon is formed as the metal oxide layer 109.

The metal oxide layer 109 is formed using, typically, zirconium oxide, titanium oxide, hafnium oxide, vanadium oxide, niobium oxide, tantalum oxide, chromium oxide, molybdenum oxide, tungsten oxide, cobalt oxide, nickel oxide, or the like. Note that when the current collector 101 is formed using titanium, zirconium, niobium, tungsten, or the like, the metal oxide layer 109 is formed using an oxide semiconductor such as titanium oxide, zirconium oxide, niobium oxide, or tungsten oxide; thus, resistance between the current collector 101 and the active material layer 103 can be reduced and the electric conductivity of the electrode can be increased. Therefore, the discharge capacity can be even larger.

With the mixed layer 107 between the current collector 101 and the active material layer 103, resistance at the interface between the current collector 101 and the active material layer 103 can be reduced; thus, the electric conductivity of the negative electrode can be increased. Therefore, the discharge capacity can be even larger. In addition, the adhesion between the current collector 101 and the active material layer 103 can be increased, so that degradation of the power storage device can be suppressed.

The active material layer 103 includes a crystalline silicon region 103a and a whisker-like crystalline silicon region 103b formed over the crystalline silicon region 103a. Note that the interface between the crystalline silicon region 103a and the whisker-like crystalline silicon region 103b is not clear. Therefore, a plane that is in the same level as the bottom of the deepest valley of valleys formed among protrusions in the whisker-like crystalline silicon region 103b and is parallel to the surface of the current collector 101 is regarded as the interface between the crystalline silicon region 103a and the whisker-like crystalline silicon region 103b.

The crystalline silicon region 103a covers the current collector 101. The whisker-like crystalline silicon region 103b looks like whiskers where protrusions are dispersed. Note that a protrusion in the whisker-like crystalline silicon region 103b may have a columnar shape such as a cylinder shape or a prism shape, or a needle shape such as a cone shape or a pyramid shape. The top of the protrusion may be curved. A width of the protrusion is greater than or equal to 50 nm and less than or equal to 10 μm, preferably greater than or equal to 500 nm and less than or equal to 3 μm. In addition, a length in an axis of the protrusion is greater than or equal to 0.5 μm and less than or equal to 1000 μm, preferably greater than or equal to 2.5 μm and less than or equal to 100 μm.

Note that the length h in the axis of the protrusion means the distance between the top of the protrusion and the crystalline silicon region 103a in the axis running through the top of the protrusion or the center of the top surface of the protrusion. In addition, the thickness of the crystalline silicon layer is the sum of the thickness of the crystalline silicon region 103a and the length of a perpendicular line from the top of the protrusion in the whisker-like crystalline silicon region 103b to the crystalline silicon region 103a (that is, the height of the protrusion).

Note that the direction in which a protrusion extends from the crystalline silicon region 103a is referred to as a long-side direction. A cross-sectional shape along the long-side direction is referred to as a long-side cross-sectional shape. In addition, the shape of a plane in which the long-side direction is a normal direction is referred to as a sliced cross-sectional shape.

As illustrated in FIG. 1B, the long-side direction of the protrusions formed in the whisker-like crystalline silicon region 103b may be one direction, e.g., the normal direction to the surface of the crystalline silicon region 103a. Note that the long-side direction of the protrusions may be substantially the same as the normal direction to the surface of the crystalline silicon region 103a, and it is preferable that the difference between the two directions be typically within 5°. Thus, in FIG. 1B, only the long-side cross-sectional shape is illustrated in the whisker-like crystalline silicon region 103b.

The electrode of the power storage device described in this embodiment includes, in the crystalline silicon layer functioning as the active material layer, a plurality of protrusions each of which has a width φ of greater than or equal to 50 nm and less than or equal to 10 μm, preferably greater than or equal to 500 nm and less than or equal to 3 μm, and in the axis, a length h of greater than or equal to 0.5 μm and less than or equal to 1000 μm, preferably greater than or equal to 2.5 μm and less than or equal to 100 μm. Therefore, the surface area of the active material layer can be increased, so that the discharge capacity can be larger.

Figure 1C:
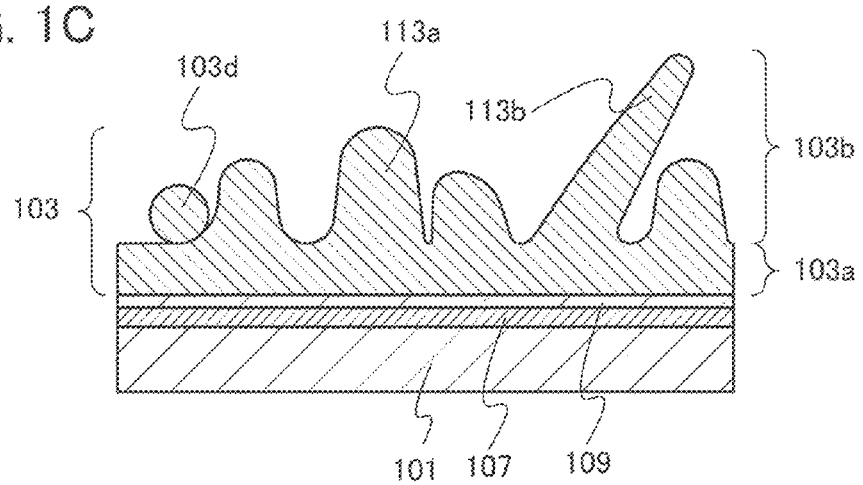

Alternatively, as illustrated in FIG. 1C, the long-side directions of the protrusions formed in the whisker-like crystalline silicon region 103b may be random. Typically, the whisker-like crystalline silicon region 103b may include a first protrusion 113a whose long-side direction is substantially the same as the normal direction and a second protrusion 113b whose long-side direction is different from the normal direction. Further, the length in the axis of the second protrusion 113b may be greater than that of the first protrusion 113a. Thus, FIG. 1C illustrates, in the whisker-like crystalline silicon region 103b, a protrusion having a sliced cross-sectional shape like a region 103d, in addition to the protrusions having long-side cross-sectional shapes. The region 103d is circular because it is a cross-sectional shape in a transverse direction of a protrusion having a cylinder or cone shape. However, when the protrusion has a prism or pyramid shape, the region 103d is polygonal. When the long-side directions of the protrusions are random, the protrusions are tangled with each other in some cases; therefore, the protrusions are unlikely to be eliminated in charge and discharge of the power storage device.

Figure 1D:
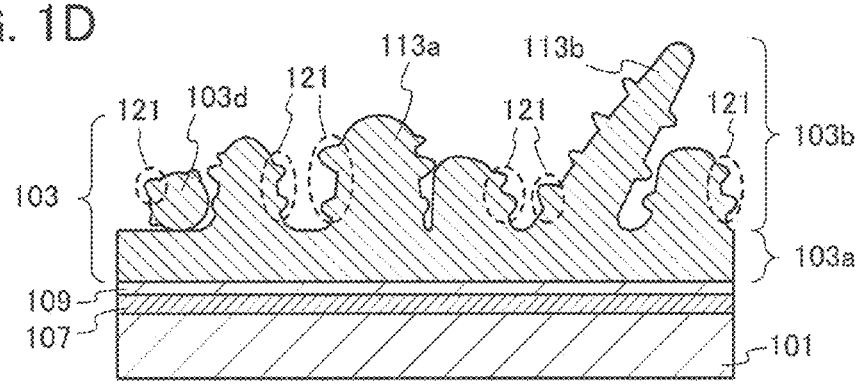

In addition, as illustrated in FIG. 1D, a protrusion may include a depression and projection 121 (also referred to as a depression and a projection). Alternatively, a protrusion may include either a depression or a projection. By including the depression and projection 121, the protrusion can have a larger surface area. That is, the surface area per unit mass of the active material layer 103 can be larger than that in FIG. 1C; therefore, the discharge capacity or the charge capacity can be larger.

The electrode of the power storage device described in this embodiment includes at least the mixed layer between the current collector and the crystalline silicon layer functioning as the active material layer. Thus, interface resistance between the current collector and the crystalline silicon layer can be reduced, and adhesion between the current collector and the crystalline silicon layer can be increased; therefore, the discharge capacity can be larger and the degradation of the power storage device can be suppressed.

Figure 2:
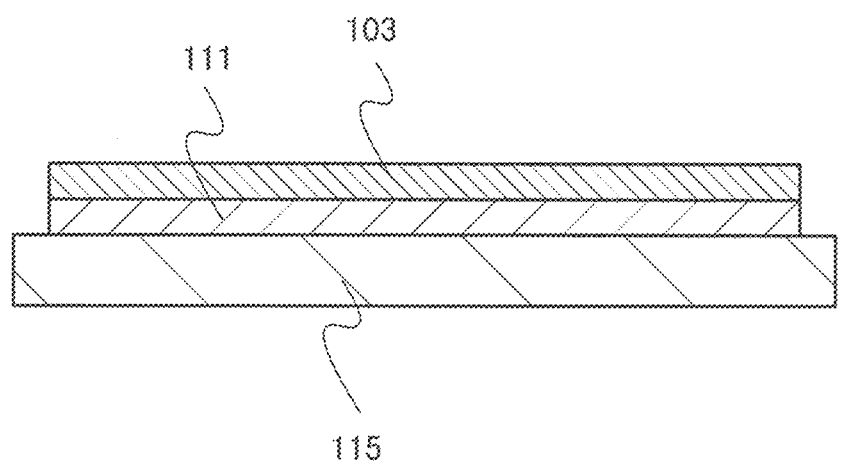
FIG. 2 is a cross-sectional view illustrating a method for manufacturing a negative electrode of a power storage device.

Note that FIGS. 1A to 1D illustrate the case where the current collector 101 is formed using a conductive material having a foil shape, a plate shape, or a net shape; however, as illustrated in FIG. 2, a current collector 111 can be formed by a sputtering method, an evaporation method, a printing method, an inkjet method, a CVD method, or the like as appropriate over a substrate 115, and the active material layer 103 can be formed over the current collector 111.

Through the above process, the electrode of the power storage device having a large discharge capacity can be manufactured.

Embodiment 2

In this embodiment, a structure of a power storage device will be described with reference to FIGS. 3A and 3B.

First, a structure of a secondary battery is described below as a power storage device.

Among secondary batteries, a lithium ion battery formed using a metal oxide containing lithium, such as $LiCoO_2$, has a large discharge capacity and high safety. Here, a structure of a lithium ion battery, which is a typical example of the secondary battery, is described.

Figure 3A:
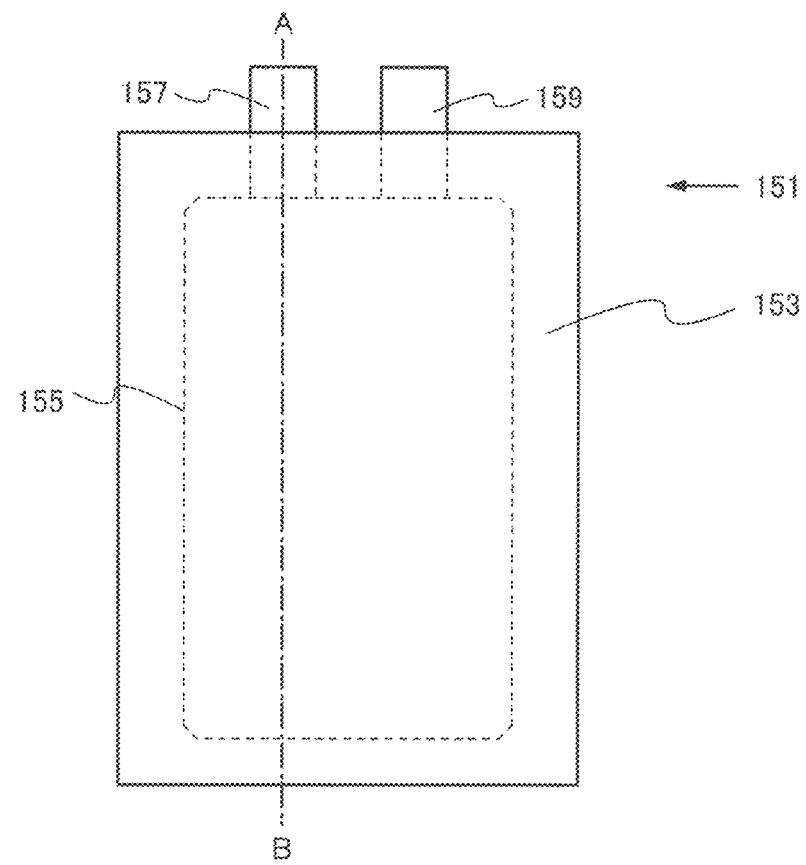
FIGS. 3A and 3B are a plan-view and a cross-sectional view illustrating one embodiment of a power storage device.
Figure 3B:
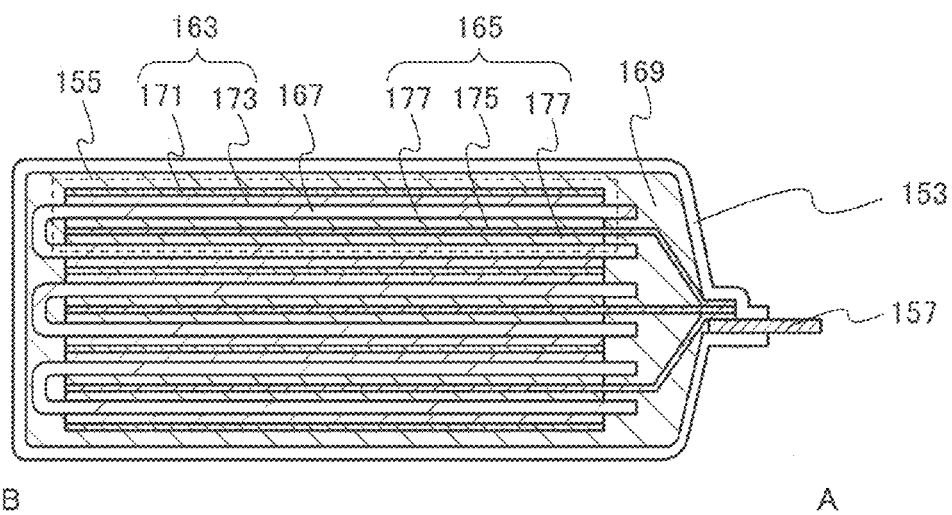

FIG. 3A is a plan-view of a power storage device 151, and FIG. 3B is a cross-sectional view taken along dot-dashed line A-B in FIG. 3A.

The power storage device 151 illustrated in FIG. 3A includes a power storage cell 155 in an exterior member 153. The power storage device 151 further includes terminal portions 157 and 159 which are connected to the power storage cell 155. For the exterior member 153, a laminate film, a polymer film, a metal film, a metal case, a plastic case, or the like can be used.

As illustrated in FIG. 3B, the power storage cell 155 includes a negative electrode 163, a positive electrode 165, a separator 167 between the negative electrode 163 and the positive electrode 165, and an electrolyte 169 with which the exterior member 153 including the power storage cell 155 and the separator 167 is filled.

The negative electrode 163 includes a negative electrode current collector 171 and a negative electrode active material layer 173.

The positive electrode 165 includes a positive electrode current collector 175 and a positive electrode active material layer 177. The negative electrode active material layer 173 is formed on one or both of the surfaces of the negative electrode current collector 171. The positive electrode active material layer 177 is formed on one or both of the surfaces of the positive electrode current collector 175.

The negative electrode current collector 171 is connected to the terminal portion 159. The positive electrode current collector 175 is connected to the terminal portion 157. Further, the terminal portions 157 and 159 each partly extend outside the exterior member 153.

Note that although a sealed thin power storage device is described as the power storage device 151 in this embodiment, a power storage device can have a variety of structures, e.g., a button-type power storage device, a cylindrical power storage device, or a rectangular power storage device. Further, although the structure where the positive electrode, the negative electrode, and the separator are stacked is described in this embodiment, a structure where the positive electrode, the negative electrode, and the separator are rolled may be employed.

The negative electrode current collector 171 can be formed using the current collector 101 or 111 described in Embodiment 1.

The negative electrode active material layer 173 can be formed using the active material layer 103, which is formed using the crystalline silicon layer described in Embodiment 1. Note that the crystalline silicon layer may be pre-doped with lithium. In addition, by forming the active material layer 103, which is formed using the crystalline silicon layer, with the negative electrode current collector 171 held by a frame-like susceptor in an LPCVD apparatus, the active material layer 103 can be formed on both of the surfaces of the negative electrode current collector 171 at the same time; therefore, the number of manufacturing processes can be reduced when the electrode is configured using both of the surfaces of the negative electrode current collector 171.

The positive electrode current collector 175 is formed using aluminum, stainless steel, or the like. The positive electrode current collector 175 can have a foil shape, a plate shape, a net shape, or the like as appropriate.

The positive electrode active material layer 177 can be formed using $LiFeO_2$, $LiCoO_2$, $LiNiO_2$, $LiMn_2O_4$, $LiFePO_4$, $LiCoPO_4$, $LiNiPO_4$, $LiMn_2PO_4$, $V_2O_5$, $Cr_2O_5$, $MnO_2$, or other lithium compounds as a material. Note that when carrier ions are alkali metal ions other than lithium ions, alkaline earth metal ions, beryllium ions, or magnesium ions, the positive electrode active material layer 177 can be formed using, instead of lithium in the above lithium compounds, an alkali metal (e.g., sodium or potassium), an alkaline earth metal (e.g., calcium, strontium, or barium), beryllium, or magnesium.

As a solute of the electrolyte 169, a material in which lithium ions, i.e., carrier ions, can transfer and stably exist is used. Typical examples of the solute of the electrolyte 169 include lithium salt such as $LiClO_4$, $LiAsF_6$, $LiBF_4$, $LiPF_6$, and $Li(C_2F_5SO_2)_2N$. Note that when carrier ions are alkali metal ions other than lithium ions or alkaline earth metal ions, the solute of the electrolyte 169 can be formed using alkali metal salt such as sodium salt or potassium salt, alkaline earth metal salt such as calcium salt, strontium salt, or barium salt, beryllium salt, magnesium salt, or the like, as appropriate.

As a solvent of the electrolyte 169, a material in which lithium ions can transfer is used. As the solvent of the electrolyte 169, an aprotic organic solvent is preferably used. Typical examples of the aprotic organic solvent include ethylene carbonate, propylene carbonate, dimethyl carbonate, diethyl carbonate, γ-butyrolactone, acetonitrile, dimethoxyethane, tetrahydrofuran, and the like, and one or more of these materials can be used. When a gelled polymer is used as the solvent of the electrolyte 169, safety against liquid leakage or the like is increased. In addition, the power storage device 151 can be thin and lightweight. Typical examples of the gelled polymer include a silicon gel, an acrylic gel, an acrylonitrile gel, polyethylene oxide, polypropylene oxide, a fluorine-based polymer, and the like.

As the electrolyte 169, a solid electrolyte such as $Li_3PO_4$ can be used.

For the separator 167, an insulating porous material is used. Typical examples of the separator 167 include cellulose (paper), polyethylene, polypropylene, and the like.

A lithium ion battery has a small memory effect, a high energy density, and a large discharge capacity. In addition, the driving voltage of a lithium ion battery is high. Thus, the size and weight of the lithium ion battery can be reduced. Further, the lithium ion battery does not easily degrade due to repetitive charge and discharge and can be used for a long time, so that cost can be reduced.

Next, a capacitor is described as a power storage device. Typical examples of the capacitor include an electrical double-layer capacitor, a lithium ion capacitor, and the like.

In the case of a capacitor, instead of the positive electrode active material layer 177 in the secondary battery in FIG. 3B, a material capable of reversibly adsorbing and releasing lithium ions and/or anions is preferably used. Typically, the positive electrode active material layer 177 can be formed using active carbon, a conductive polymer, or a polyacene organic semiconductor (PAS).

The lithium ion capacitor has high efficiency of charge and discharge, capability of rapidly performing charge and discharge, and a long life even when it is repeatedly used.

By using the negative electrode described in Embodiment 1 as the negative electrode 163, a power storage device having a large discharge capacity can be manufactured.

In addition, by using the current collector and the active material layer described in Embodiment 1 in a negative electrode of an air cell which is one embodiment of the power storage device, a power storage device having a large discharge capacity can be manufactured.

Embodiment 3

In this embodiment, an application example of the power storage device described in Embodiment 2 is described with reference to FIGS. 4A and 4B.

The power storage device described in Embodiment 2 can be used in electronic devices, e.g., cameras such as digital cameras or video cameras, digital photo frames, mobile phones (also referred to as cellular phones or cellular phone devices), portable game machines, portable information terminals, or audio reproducing devices. Further, the power storage device can be used in electric propulsion vehicles such as electric vehicles, hybrid electric vehicles, train vehicles, maintenance vehicles, carts, or wheelchairs. Here, as a typical example of the electric propulsion vehicles, a wheelchair is described.

Figure 4A:
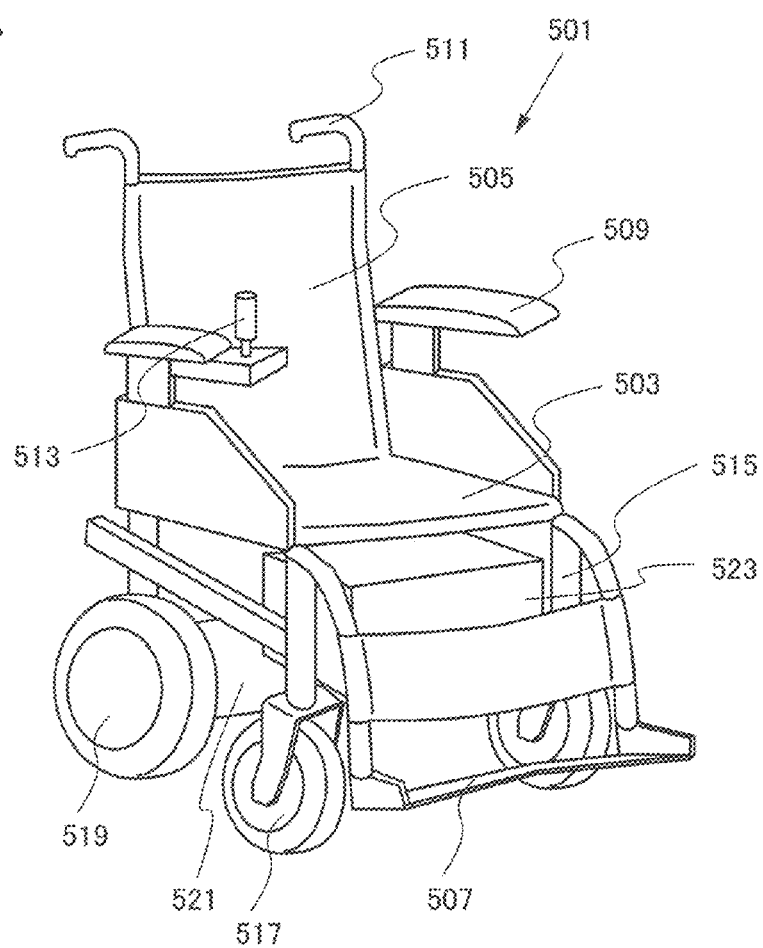
FIGS. 4A and 4B are perspective views each illustrating one embodiment of application of a power storage device.

FIG. 4A is a perspective view of an electric wheelchair 501. The electric wheelchair 501 includes a seat 503 where a user sits down, a backrest 505 provided behind the seat 503, a footrest 507 provided at the front of and below the seat 503, armrests 509 provided on the left and right of the seat 503, and a handle 511 provided above and behind the backrest 505. A controller 513 for controlling the operation of the wheelchair is provided for one of the armrests 509. A pair of front wheels 517 is provided at the front of and below the seat 503 through a frame 515 provided below the seat 503, and a pair of rear wheels 519 is provided behind and below the seat 503. The rear wheels 519 are connected to a driving portion 521 having a motor, a brake, a gear, and the like. A control portion 523 including a battery, a power controller, a control means, and the like are provided under the seat 503. The control portion 523 is connected to the controller 513 and the driving portion 521. The driving portion 521 drives through the control portion 523 with the operation of the controller 513 by the user and the control portion 523 controls the operation of moving forward, moving back, turning around, and the like, and the speed of the electric wheelchair 501.

The power storage device described in Embodiment 2 can be used in the battery of the control portion 523. The battery of the control portion 523 can be externally charged by electric power supply using plug-in systems or contactless power feeding. Note that in the case where the electric propulsion vehicle is a train vehicle, the train vehicle can be charged by electric power supply from an overhead cable or a conductor rail.

Figure 4B:
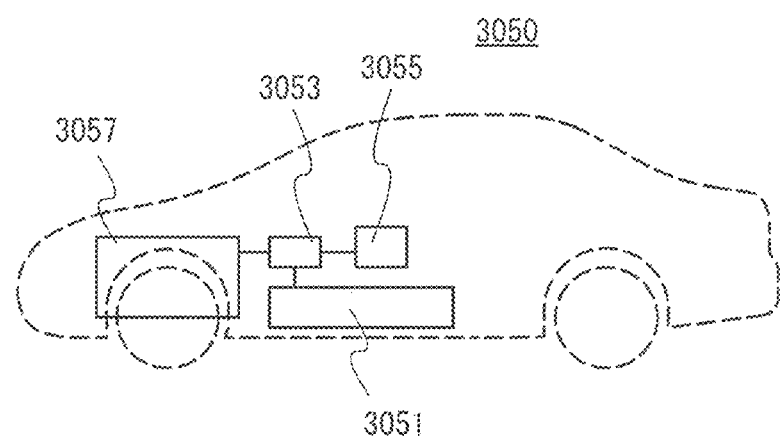

FIG. 4B illustrates an example of an electric vehicle. An electric vehicle 3050 is equipped with a power storage device 3051. The output of the electric power of the power storage device 3051 is controlled by a control circuit 3053 and the electric power is supplied to a driving device 3057. The control circuit 3053 is controlled by a computer 3055.

The driving device 3057 includes a DC motor or an AC motor either alone or in combination with an internal-combustion engine. The computer 3055 outputs a control signal to the control circuit 3053 based on an input signal such as data of a driver's operation (e.g., acceleration, deceleration, or stop) or data during driving (e.g., data of an upgrade or a downgrade or data of a load on a driving wheel) of the electric vehicle 3050. The control circuit 3053 adjusts the electric energy supplied from the power storage device 3051 in accordance with the control signal of the computer 3055 to control the output of the driving device 3057. In the case where the AC motor is mounted, an inverter which converts direct current into alternate current is incorporated.

Charge of the power storage device 3051 can be performed by external electric power supply using a plug-in technique. With the power storage device according to one embodiment of the present invention, which is equipped as the power storage device 3051, charge time can be shortened and convenience can be improved. In addition, since charge and discharge rate is increased, accelerating capability of the electric vehicle 3050 can be increased and performance of the electric vehicle 3050 can be improved. When the power storage device 3051 itself can be formed to be compact and lightweight as a result of improved characteristics of the power storage device 3051, the vehicle can be lightweight and fuel efficiency can be increased.

Note that this embodiment can be implemented in combination with any of the other embodiments or examples as appropriate.

Embodiment 4

In this embodiment, an example in which the power storage device according to one embodiment of the present invention is used in a wireless power feeding system (hereinafter referred to as an RF power feeding system) will be described with reference to block diagrams in FIG. 10 and FIG. 11. In each of the block diagrams, independent blocks show elements within a power receiving device and a power feeding device, which are classified according to their functions. However, it may be practically difficult to completely separate the elements according to their functions; in some cases, one element can involve a plurality of functions.

First, the RF power feeding system is described with reference to FIG. 10.

A power receiving device 600 is an electronic device or an electric propulsion vehicle which is driven by electric power supplied from a power feeding device 700, and can be applied to another device which is driven by electric power, as appropriate. Typical examples of the electronic device include cameras such as digital cameras or video cameras, digital photo frames, mobile phones (also referred to as cellular phones or cellular phone devices), portable game machines, portable information terminals, audio reproducing devices, display devices, computers, and the like. Typical examples of the electric propulsion vehicles include electric vehicles, hybrid electric vehicles, train vehicles, maintenance vehicles, carts, wheelchairs, and the like. In addition, the power feeding device 700 has a function of supplying electric power to the power receiving device 600.

Figure 10:
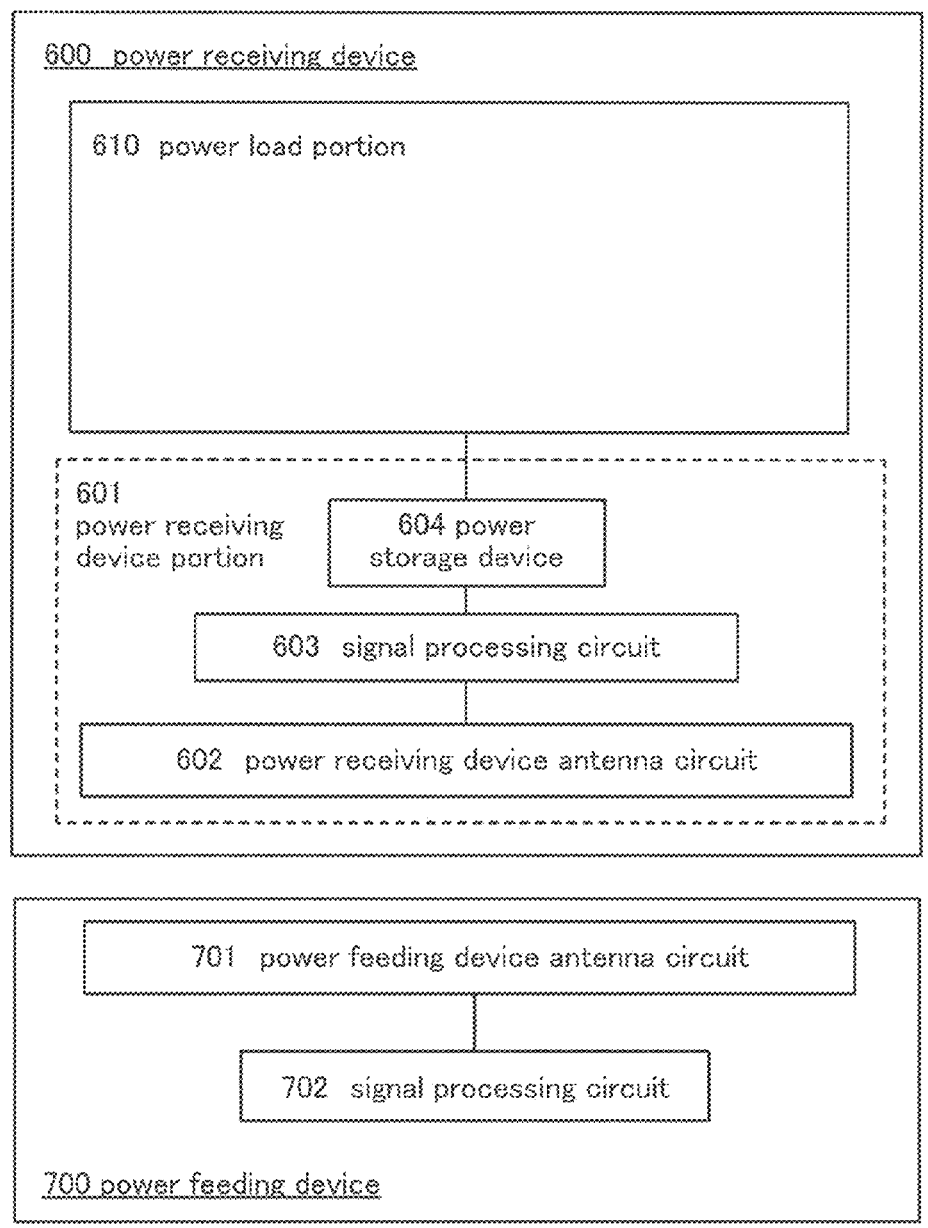
FIG. 10 is a diagram showing a configuration of a wireless power feeding system.

In FIG. 10, the power receiving device 600 includes a power receiving device portion 601 and a power load portion 610. The power receiving device portion 601 includes at least a power receiving device antenna circuit 602, a signal processing circuit 603, and a power storage device 604. The power feeding device 700 includes at least a power feeding device antenna circuit 701 and a signal processing circuit 702.

The power receiving device antenna circuit 602 has a function of receiving a signal transmitted by the power feeding device antenna circuit 701 or transmitting a signal to the power feeding device antenna circuit 701. The signal processing circuit 603 processes a signal received by the power receiving device antenna circuit 602 and controls charging of the power storage device 604 and supplying of electric power from the power storage device 604 to the power load portion 610. In addition, the signal processing circuit 603 controls operation of the power receiving device antenna circuit 602. That is, the signal processing circuit 603 can control the intensity, the frequency, or the like of a signal transmitted by the power receiving device antenna circuit 602. The power load portion 610 is a driving portion which receives electric power from the power storage device 604 and drives the power receiving device 600. Typical examples of the power load portion 610 include a motor, a driving circuit, and the like. Another device which drives the power receiving device by receiving electric power can be used as the power load portion 610 as appropriate. The power feeding device antenna circuit 701 has a function of transmitting a signal to the power receiving device antenna circuit 602 or receiving a signal from the power receiving device antenna circuit 602. The signal processing circuit 702 processes a signal received by the power feeding device antenna circuit 701. In addition, the signal processing circuit 702 controls operation of the power feeding device antenna circuit 701. That is, the signal processing circuit 702 can control the intensity, the frequency, or the like of a signal transmitted by the power feeding device antenna circuit 701.

The power storage device according to one embodiment of the present invention is used as the power storage device 604 included in the power receiving device 600 in the RF power feeding system illustrated in FIG. 10.

With the use of the power storage device according to one embodiment of the present invention in the RF power feeding system, the amount of power storage can be larger than that in a conventional power storage device. Therefore, the time interval of the wireless power feeding can be longer (frequent power feeding can be omitted).

In addition, with the use of the power storage device according to one embodiment of the present invention in the RF power feeding system, the power receiving device 600 can be formed to be compact and lightweight if the amount of power storage with which the power load portion 610 can be driven is the same as that in a conventional power storage device. Therefore, the total cost can be reduced.

Next, another example of the RF power feeding system is described with reference to FIG. 11.

Figure 11:
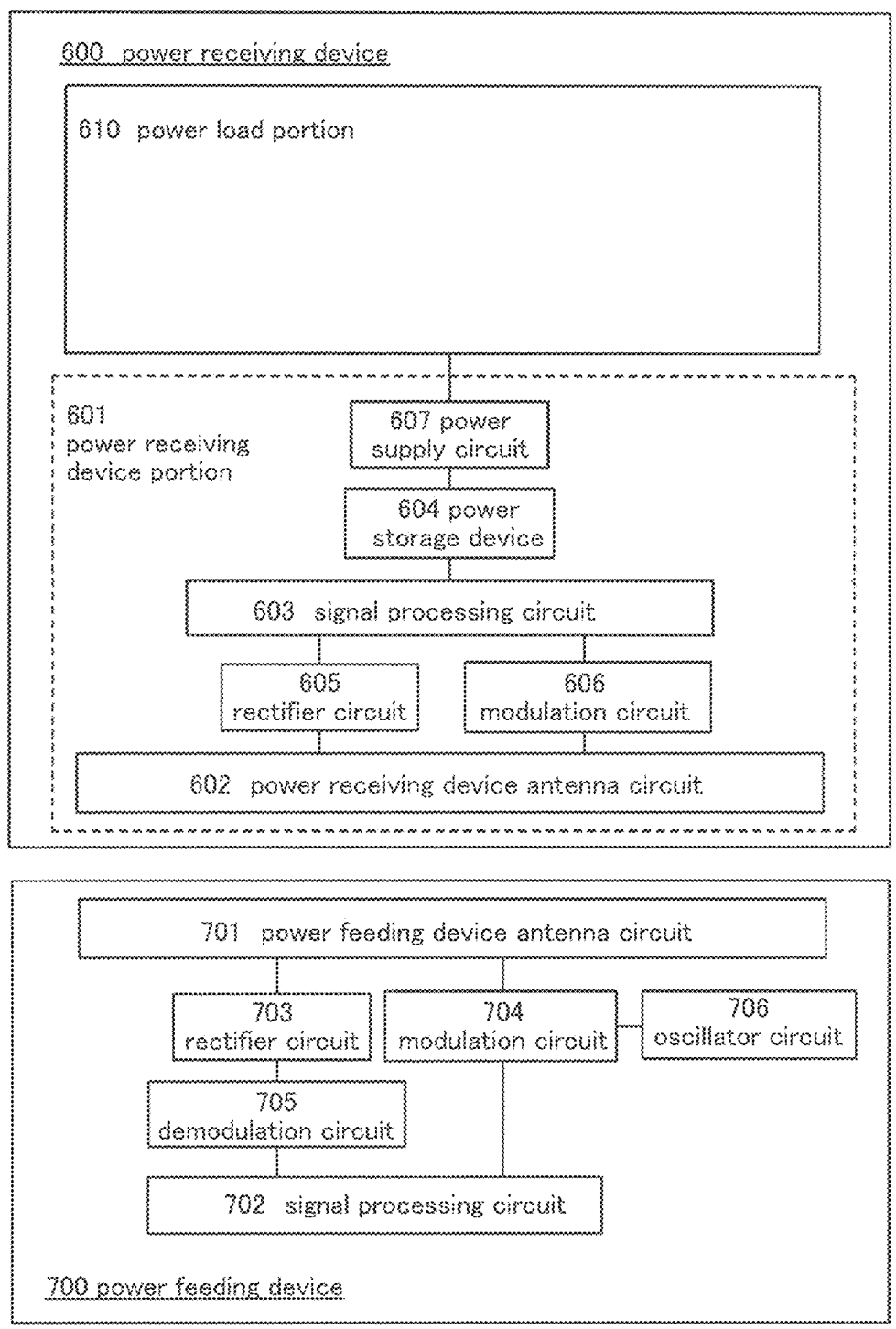
FIG. 11 is a diagram showing a configuration of a wireless power feeding system.

In FIG. 11, the power receiving device 600 includes the power receiving device portion 601 and the power load portion 610. The power receiving device portion 601 includes at least the power receiving device antenna circuit 602, the signal processing circuit 603, the power storage device 604, a rectifier circuit 605, a modulation circuit 606, and a power supply circuit 607. In addition, the power feeding device 700 includes at least the power feeding device antenna circuit 701, the signal processing circuit 702, a rectifier circuit 703, a modulation circuit 704, a demodulation circuit 705, and an oscillator circuit 706.

The power receiving device antenna circuit 602 has a function of receiving a signal transmitted by the power feeding device antenna circuit 701 or transmitting a signal to the power feeding device antenna circuit 701. When the power receiving device antenna circuit 602 receives a signal transmitted by the power feeding device antenna circuit 701, the rectifier circuit 605 has a function of generating DC voltage from the signal received by the power receiving device antenna circuit 602. The signal processing circuit 603 has a function of processing a signal received by the power receiving device antenna circuit 602 and controlling charging of the power storage device 604 and supplying of electric power from the power storage device 604 to the power supply circuit 607. The power supply circuit 607 has a function of converting voltage stored by the power storage device 604 into voltage needed for the power load portion 610. The modulation circuit 606 is used when a certain response is transmitted from the power receiving device 600 to the power feeding device 700.

With the power supply circuit 607, electric power supplied to the power load portion 610 can be controlled. Thus, overvoltage application to the power load portion 610 can be suppressed, and deterioration or breakdown of the power receiving device 600 can be reduced.

In addition, with the modulation circuit 606, a signal can be transmitted from the power receiving device 600 to the power feeding device 700. Therefore, when the amount of charged power in the power receiving device 600 is judged and a certain amount of power is charged, a signal is transmitted from the power receiving device 600 to the power feeding device 700 so that power feeding from the power feeding device 700 to the power receiving device 600 can be stopped. As a result, the power storage device 604 is not fully charged, so that the number of charge times of the power storage device 604 can be increased.

The power feeding device antenna circuit 701 has a function of transmitting a signal to the power receiving device antenna circuit 602 or receiving a signal from the power receiving device antenna circuit 602. When a signal is transmitted to the power receiving device antenna circuit 602, the signal processing circuit 702 generates a signal which is transmitted to the power receiving device 600. The oscillator circuit 706 is a circuit which generates a signal with a constant frequency. The modulation circuit 704 has a function of applying voltage to the power feeding device antenna circuit 701 in accordance with the signal generated by the signal processing circuit 702 and the signal with a constant frequency generated by the oscillator circuit 706. Thus, a signal is output from the power feeding device antenna circuit 701. On the other hand, when reception of a signal from the power receiving device antenna circuit 602 is performed, the rectifier circuit 703 has a function of rectifying the received signal. From signals rectified by the rectifier circuit 703, the demodulation circuit 705 extracts a signal transmitted from the power receiving device 600 to the power feeding device 700. The signal processing circuit 702 has a function of analyzing the signal extracted by the demodulation circuit 705.

Note that any circuit may be provided between circuits as long as the RF power feeding can be performed. For example, after the power receiving device 600 receives a signal and the rectifier circuit 605 generates DC voltage, a circuit such as a DC-DC converter or regulator that is provided in a subsequent stage may generate constant voltage. Thus, overvoltage application to the inside of the power receiving device 600 can be suppressed.

A power storage device according to one embodiment of the present invention is used as the power storage device 604 included in the power receiving device 600 in the RF power feeding system illustrated in FIG. 11.

With the use of the power storage device according to one embodiment of the present invention in the RF power feeding system, the amount of power storage can be larger than that in a conventional power storage device. Therefore, the time interval of the wireless power feeding can be longer (frequent power feeding can be omitted).

In addition, with the use of the power storage device according to one embodiment of the present invention in the RF power feeding system, the power receiving device 600 can be formed to be compact and lightweight if the amount of power storage with which the power load portion 610 can be driven is the same as that in a conventional power storage device. Therefore, the total cost can be reduced.

Note that when the power storage device according to one embodiment of the present invention is used in the RF power feeding system and the power receiving device antenna circuit 602 and the power storage device 604 are overlapped with each other, it is preferable that the impedance of the power receiving device antenna circuit 602 is not changed by deformation of the power storage device 604 due to charge and discharge of the power storage device 604 and deformation of an antenna due to the above deformation. When the impedance of the antenna is changed, in some cases, electric power is not supplied sufficiently. For example, the power storage device 604 may be placed in a battery pack formed using metal or ceramics. Note that in that case, the power receiving device antenna circuit 602 and the battery pack are preferably separated from each other by several tens of micrometers or more.

In this embodiment, the charging signal has no limitation on its frequency and may have any band of frequency as long as electric power can be transmitted. For example, the charging signal may have any of an LF band of 135 kHz (long wave), an HF band of 13.56 MHz, a UHF band of 900 MHz to 1 GHz, and a microwave band of 2.45 GHz.

A signal transmission method may be properly selected from various methods including an electromagnetic coupling method, an electromagnetic induction method, a resonance method, and a microwave method. In order to prevent energy loss due to foreign substances containing moisture, such as rain and mud, the electromagnetic induction method or the resonance method using a low frequency band, specifically, very-low frequencies of 3 kHz to 30 kHz, low frequencies of 30 kHz to 300 kHz, medium frequencies of 300 kHz to 3 MHz, or high frequencies of 3 MHz to 30 MHz is preferably used.

This embodiment can be implemented in combination with any of the above embodiments.

Example 1

In this example, a secondary battery which is one embodiment of the present invention will be described with reference to FIGS. 5A and 5B, FIG. 6, FIG. 7, FIG. 8, and FIG. 9. In this example, the secondary battery which is one embodiment of the present invention and a secondary battery for comparison (hereinafter referred to as a comparative secondary battery) were manufactured and their characteristics were compared.

(Step for Manufacturing Electrode of Secondary Battery)

First, a step for manufacturing an electrode of the secondary battery is described.

An active material layer was formed over a current collector, so that the electrode of the secondary battery was manufactured.

As a material of the current collector, titanium was used. As the current collector, a sheet of a titanium film (also referred to as a titanium sheet) with a thickness of 100 μm was used.

For the active material layer, crystalline silicon was used.

Over the titanium film, which is the current collector, crystalline silicon was deposited by an LPCVD method. The deposition of crystalline silicon by the LPCVD method was performed as follows: silane was introduced as a source gas into a reaction chamber with a flow rate of 300 sccm, the pressure of the reaction chamber was 20 Pa, and the temperature of the reaction chamber was 600° C. The reaction chamber was made of quartz. When the temperature of the current collector was increased, a small amount of a He gas was introduced.

A crystalline silicon layer obtained in the above step was used as the active material layer of the secondary battery.

(Structure of Electrode of Secondary Battery)

Figure 5A:
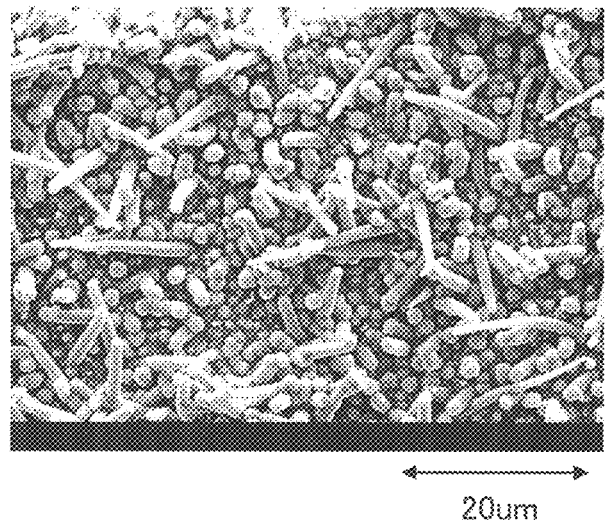
FIGS. 5A and 5B are a plan-view SEM image and a plan-view SIM image of an active material layer.

FIG. 5A shows a plan-view scanning-electron-microscope (SEM) image of the crystalline silicon obtained in the above step. As shown in FIG. 5A, the crystalline silicon obtained in the above step was like whiskers including a large number of columnar or needle-like protrusions. Therefore, the surface area of the active material layer can be increased. Lengths in axes of long protrusions are approximately 15 μm to 20 μm. In addition, without limitation to long protrusions having such great lengths in the axes, a plurality of short protrusions having small lengths in axes exist among the protrusions having great lengths in the axes.

Some protrusions have axes substantially perpendicular to the titanium film, and some protrusions have slanting axes.

Some protrusions have curved top portions. Some protrusions have a narrower width toward the top. Directions of the axes of the protrusions were random. In addition, the width of the root of a protrusion (a vicinity of an interface between a crystalline silicon region and the protrusions) was 1 μm to 2 μm.

Figure 5B:
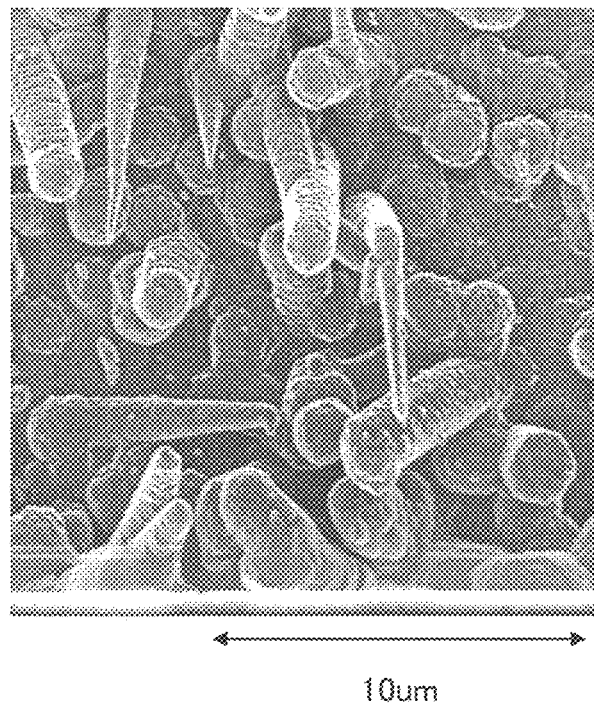

Next, FIG. 5B shows a plan-view scanning-ion-microscope (SIM) image of the crystalline silicon obtained in the above step. In FIG. 5B, protrusions having depression and projection are observed on a surface of the crystalline silicon obtained in the above step.

Figure 6:
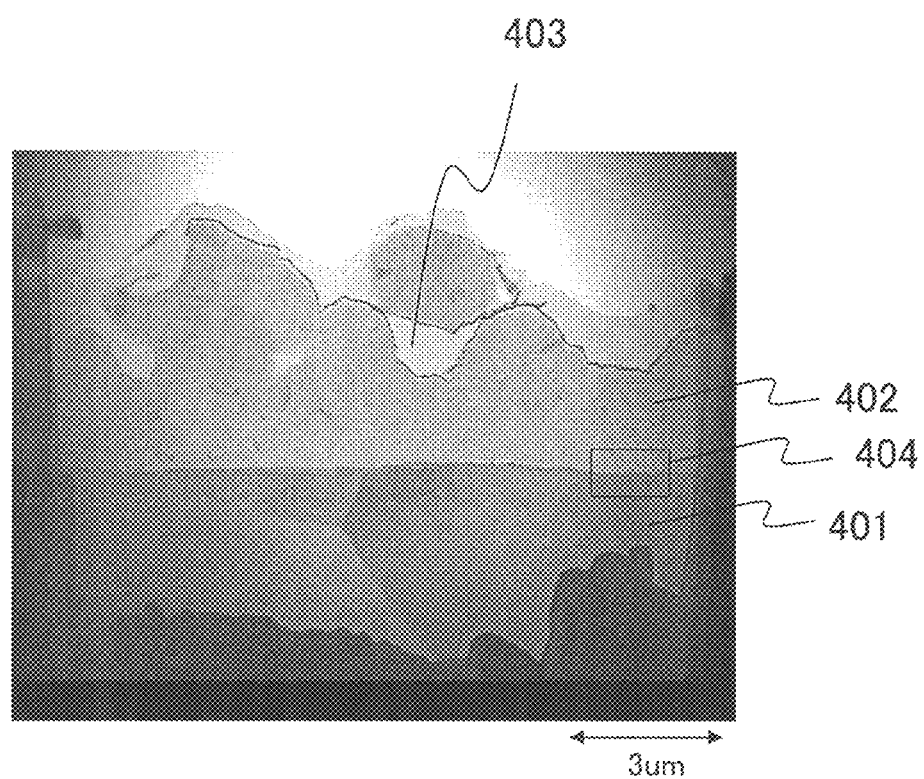
FIG. 6 is a cross-sectional TEM image of an active material layer.

Next, FIG. 6 shows a cross-sectional scanning-transmission-electron-microscope (STEM) image of the crystalline silicon obtained in the above step. As shown in FIG. 6, a crystalline silicon layer 402, which is an active material layer, is formed over a titanium film 401, which is a current collector. From FIG. 6, it is found that a low-density region is not formed in a vicinity of an interface 404 between the titanium film 401 and the crystalline silicon layer 402. The crystalline silicon layer 402 includes a crystalline silicon region and a plurality of protrusions which project from the crystalline silicon region. In addition, there is a space 403 (in other words, a region where no protrusion is present) between protrusions.

From FIG. 6, it is found that the width of a protrusion is approximately 1.0 μm to 2.5 μm.

The crystalline silicon layer 402 includes the plurality of protrusions over the crystalline silicon region. The thickness of the crystalline silicon layer including the protrusions is approximately 3.0 μm, and the thickness of the crystalline silicon region which is formed in a valley between the plurality of protrusions is approximately 1.5 μm to 2.0 μm. As shown in FIGS. 5A and 5B, the length in the axis of the long protrusion is approximately 15 μm to 20 μm, which is not shown in FIG. 6.

Figure 7:
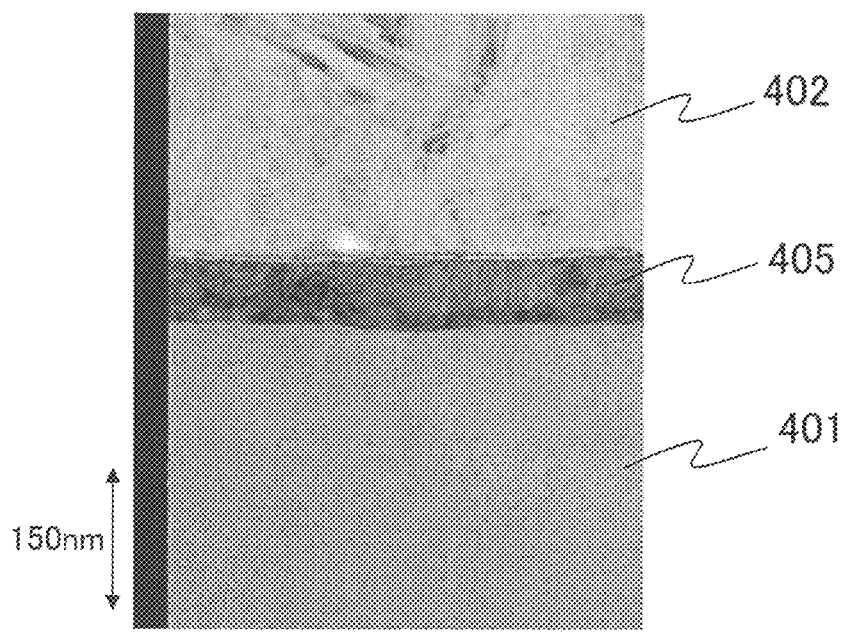
FIG. 7 is an enlarged image of a vicinity of an interface between a current collector and an active material layer.

FIG. 7 is an enlarged cross-sectional TEM image of part of FIG. 6. FIG. 7 is an enlarged image of the vicinity of the interface 404 between the titanium film 401 and the crystalline silicon layer 402 shown in FIG. 6. From FIG. 7, it is found that a layer 405 is formed in the vicinity of the interface between the titanium film 401 and the crystalline silicon layer 402.

Figure 8:
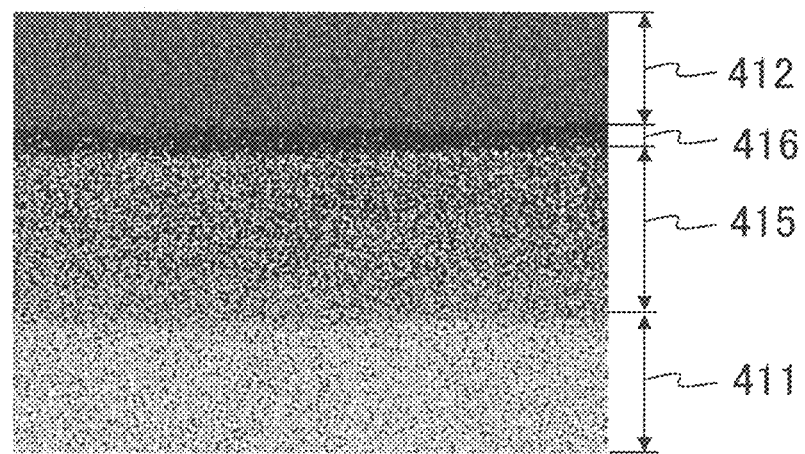
FIG. 8 shows a two-dimensional elemental mapping of a vicinity of an interface between a current collector and an active material layer using an EDX.

FIG. 8 shows a result of two-dimensional elemental mapping using an energy dispersive X-ray spectrometry (EDX) of a cross section of the vicinity of the interface between the titanium film 401 and the crystalline silicon layer 402. A region 411 contains titanium as a main component. A region 412 contains silicon as a main component. A region 416 contains oxygen and titanium as components. A region 415 contains titanium and silicon as components. The region 415 also contains oxygen as an impurity. From FIG. 8, it is found that the region 411 containing titanium as a main component, the region 415 containing titanium and silicon as components, the region 416 containing oxygen and titanium as components, and the region 412 containing silicon as a main component are stacked in this order. The region 411 corresponds to the titanium film 401, and the region 412 corresponds to the crystalline silicon layer 402. The region 415 is a mixed layer containing titanium and silicon. The region 416 is a metal oxide layer.

In addition, it is found that the region 411 containing titanium as a main component also partially contains iron and nickel.

From the result of two-dimensional elemental mapping using an EDX shown in FIG. 8, it is found that the layer 405 shown in FIG. 7 includes the mixed layer containing titanium and silicon and the metal oxide layer over the mixed layer. In the measurement area shown in FIG. 8, the metal oxide layer is formed to cover the entire surface of the mixed layer. The thickness of the mixed layer containing titanium and silicon, which is included in the layer 405, is approximately 65 nm to 75 nm.

(Step for Manufacturing Secondary Battery)

A step for manufacturing the secondary battery of this example is described.

The electrode was obtained by forming the active material layer over the current collector as described above. The secondary battery was manufactured using the electrode obtained. Here, a coin-type secondary battery was manufactured. A method for manufacturing the coin-type secondary battery is described with reference to FIG. 9.

Figure 9:
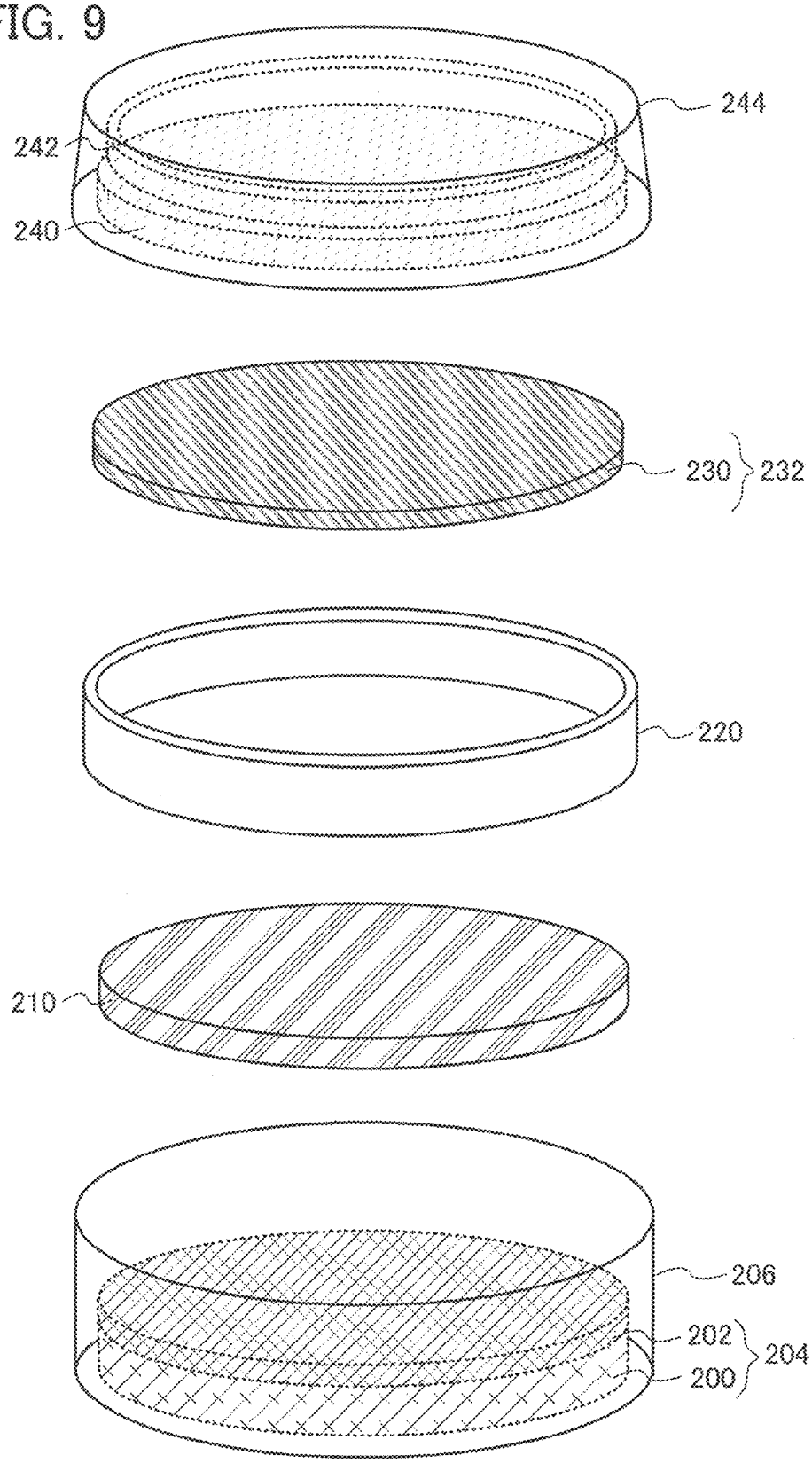
FIG. 9 illustrates an example of a method for manufacturing a secondary battery.

As illustrated in FIG. 9, the coin-type secondary battery includes an electrode 204, a reference electrode 232, a separator 210, an electrolyte (not illustrated), a housing 206, and a housing 244. Besides, the coin-type secondary battery includes a ring-shaped insulator 220, a spacer 240, and a washer 242. As the electrode 204, the electrode that was obtained in the above step by forming an active material layer 202 over a current collector 200 was used. The reference electrode 232 includes a reference electrode active material layer 230. In this example, the current collector 200 was formed using a titanium foil, and the active material layer 202 was formed using the crystalline silicon layer described in Embodiment 1. In addition, the reference electrode active material layer 230 was formed using lithium metal (a lithium foil). The separator 210 was formed using polypropylene. The housing 206, the housing 244, the spacer 240, and the washer 242 each of which was made using stainless steel (SUS) were used. The housing 206 and the housing 244 have a function of making external electrical connection of the electrode 204 and the reference electrode 232.

The electrode 204, the reference electrode 232, and the separator 210 were soaked in the electrolyte. Then, as illustrated in FIG. 9, the housing 206, the electrode 204, the separator 210, the ring-shaped insulator 220, the reference electrode 232, the spacer 240, the washer 242, and the housing 244 were stacked in this order so that the housing 206 was positioned at the bottom of the stacked components. The housing 206 and the housing 244 were pressed and bonded to each other with a "coin cell crimper." In such a manner, the coin-type secondary battery was manufactured.

The electrolyte in which $LiPF_6$ was dissolved in a mixed solvent of ethylene carbonate (EC) and diethyl carbonate (DEC) was used.

(Step for Manufacturing Comparative Secondary Battery)

Next, a step for manufacturing an electrode of the comparative secondary battery is described. A step for manufacturing an active material layer of the comparative secondary battery is different from that of the secondary battery which is one embodiment of the present invention. The other structures of the comparative secondary battery are the same as those of the secondary battery which is one embodiment of the present invention; therefore, description of structures of a substrate, a current collector, and the like is omitted.

The active material layer of the comparative secondary battery was formed using crystalline silicon.

Amorphous silicon to which phosphorus was added was deposited by a plasma CVD method over a titanium film which is the current collector, and heating treatment was performed, so that the crystalline silicon was obtained. The deposition of the amorphous silicon by the plasma CVD method was performed as follows: silane and 5 vol % phosphine (diluted with hydrogen) were introduced as source gases into a reaction chamber with flow rates of 60 sccm and 20 sccm, respectively; the pressure of the reaction chamber was 133 Pa; the temperature of the substrate was 280° C.; the RF power source frequency was 60 MHz; the pulse frequency of the RF power source was 20 kHz; the duty ratio of the pulse was 70%; and power of the RF power source was 100 W. The thickness of the amorphous silicon was 3 μm.

After that, heat treatment at 700° C. was performed. The heat treatment was performed in an Ar atmosphere for six hours. By this heat treatment, the amorphous silicon was crystallized, so that a crystalline silicon layer was formed. The crystalline silicon layer that was formed in the above step was used as the active material layer of the comparative secondary battery. Note that phosphorus (an impurity element imparting n-type conductivity) was added to this crystalline silicon layer.

(Step for Manufacturing Comparative Secondary Battery)

A step for manufacturing the comparative secondary battery is described.

The active material layer was formed over the current collector in the above described manner, so that the electrode of the comparative secondary battery was formed. The comparative secondary battery was manufactured using the electrode. The comparative secondary battery was manufactured in a manner similar to that of the above secondary battery.

(Characteristics of Secondary Battery and Comparative Secondary Battery)

Discharge capacities of the secondary battery and the comparative secondary battery were measured using a charge-discharge measuring instrument. For the measurements of charge and discharge, a constant current mode was used, and charge and discharge were performed with a current of 2.0 mA at a rate of approximately 0.2 C. The upper limit voltage was 1.0 V, and the lower limit voltage was 0.03 V. All the measurements were performed at room temperature.

Initial characteristics of the secondary battery and the comparative secondary battery are shown in Table 1. Table 1 shows initial characteristics of the discharge capacity per unit volume (mAh/cm$^3$) of the active material layers. Here, the discharge capacity (mAh/cm$^3$) was measured on the assumption that the thickness of the active material layer of the secondary battery was 3.5 μm and the thickness of the active material layer of the comparative secondary battery was 3.0 μm.

TABLE 1

| | Capacity (mAh/cm$^3$) |
|---|---|
| Secondary Battery | 7300 |
| Comparative Secondary Battery | 4050 |

As shown in Table 1, the discharge capacity (7300 mAh/cm$^3$) of the secondary battery is approximately 1.8 times as large as the discharge capacity (4050 mAh/cm$^3$) of the comparative secondary battery.

From the above, the actual capacity of the secondary battery is close to the theoretical capacity (9800 mAh/cm$^3$) of the secondary battery. In the above manner, by using the crystalline silicon layer that is formed using the LPCVD method as the active material layer, the secondary battery with larger capacity that is close to the theoretical capacity was able to be manufactured.

This application is based on Japanese Patent Application serial no. 2010-104587 filed with Japan Patent Office on Apr. 28, 2010, Japanese Patent Application serial no. 2010-122609 filed with Japan Patent Office on May 28, 2010, Japanese Patent Application serial no. 2010-122610 filed with Japan Patent Office on May 28, 2010, and Japanese Patent Application serial no. 2010-122473 filed with Japan Patent Office on May 28, 2010, the entire contents of which are hereby incorporated by reference.

The invention claimed is:

1. A method for manufacturing a power storage device comprising:

forming over a current collector an active material layer comprising a crystalline silicon layer by a low-pressure CVD method using a deposition gas including silicon as a source gas such that a mixed layer is formed between the current collector and the crystalline silicon layer, the crystalline silicon layer comprising a crystalline silicon region and a whisker-like crystalline silicon region over the crystalline silicon region;

forming a negative electrode comprising the active material layer;

providing a positive electrode; and providing an electrolyte between the negative electrode and the positive electrode, wherein the whisker-like crystalline silicon region comprises a first protrusion and a second protrusion, wherein a length in an axis of the first protrusion is greater than or equal to 0.5 μm and less than or equal to 1000 μm, wherein a width of the first protrusion is greater than or equal to 500 nm and less than or equal to 3 μm, wherein the current collector comprises a metal element which forms silicide by reacting with silicon on a surface region of the current collector, wherein the active material layer comprising the crystalline silicon layer is formed over the current collector such that a metal oxide layer consisting essentially of the metal element and oxygen is formed between the mixed layer and the crystalline silicon layer, and wherein the mixed layer comprises silicon and the metal element.

2. The method for manufacturing a power storage device, according to claim 1, wherein the low-pressure CVD method is performed at a temperature of higher than 550° C.

3. The method for manufacturing a power storage device, according to claim 1, wherein the deposition gas including silicon is silicon hydride, silicon fluoride, or silicon chloride.

4. The method for manufacturing a power storage device, according to claim 1, wherein the current collector has a foil shape, a plate shape, or a net shape.

5. The method for manufacturing a power storage device, according to claim 1, wherein the metal element which forms silicide by reacting with silicon is zirconium, titanium, hafnium, vanadium, niobium, tantalum, chromium, molybdenum, tungsten, cobalt, or nickel.

6. The method for manufacturing a power storage device, according to claim 1, wherein the first protrusion has a narrower width toward the top.

7. The method for manufacturing a power storage device, according to claim 1, wherein a long-side direction of the first protrusion is different from a long-side direction of the second protrusion.

8. A method for manufacturing an electrode comprising:
forming over a current collector an active material layer comprising a crystalline silicon layer by a low-pressure CVD method using a deposition gas including silicon as a source gas such that a mixed layer is formed between the current collector and the crystalline silicon layer, the crystalline silicon layer comprising a crystalline silicon region and a whisker-like crystalline silicon region over the crystalline silicon region,
wherein the whisker-like crystalline silicon region comprises a first protrusion and a second protrusion,
wherein a length in an axis of the first protrusion is greater than or equal to 0.5 μm and less than or equal to 1000 μm,
wherein a width of the first protrusion is greater than or equal to 500 nm and less than or equal to 3 μm,
wherein the current collector comprises a metal element which forms silicide by reacting with silicon on a surface region of the current collector,
wherein a metal oxide layer consisting essentially of the metal element and oxygen is formed between the mixed layer and the crystalline silicon layer by the forming step, and
wherein the mixed layer comprises silicon and the metal element.

9. The method for manufacturing an electrode according to claim 8, wherein the low-pressure CVD method is performed at a temperature of higher than 550° C.

10. The method for manufacturing an electrode according to claim 8, wherein the deposition gas including silicon is silicon hydride, silicon fluoride, or silicon chloride.

11. The method for manufacturing an electrode according to claim 8, wherein the current collector has a foil shape, a plate shape, or a net shape.

12. The method for manufacturing an electrode according to claim 8, wherein the current collector is formed over a substrate by a sputtering method or a CVD method.

13. The method for manufacturing an electrode according to claim 8, wherein the first protrusion has a narrower width toward the top.

14. The method for manufacturing an electrode according to claim 8, wherein a long-side direction of the first protrusion is different from a long-side direction of the second protrusion.

15. The method for manufacturing an electrode according to claim 8, wherein a long-side direction of the first protrusion is one direction.

16. The method for manufacturing an electrode according to claim 15, wherein a difference between the long-side direction of the first protrusion and a normal direction to a surface of the crystalline silicon region is within 5°.

17. The method for manufacturing an electrode according to claim 8, wherein the metal element which forms silicide by reacting with silicon is zirconium, titanium, hafnium, vanadium, niobium, tantalum, chromium, molybdenum, tungsten, cobalt, or nickel.

18. The method for manufacturing an electrode according to claim 17, wherein the metal element which forms silicide by reacting with silicon is titanium.

19. The method for manufacturing an electrode according to claim 1, wherein the metal oxide layer is arranged between the mixed layer and the crystalline silicon layer during forming the active material layer by a low-pressure CVD method.

20. The method for manufacturing an electrode according to claim 8, wherein the metal oxide layer is arranged between the mixed layer and the crystalline silicon layer during forming the active material layer by a low-pressure CVD method.

* * * * *